(12) United States Patent
Yang et al.

(10) Patent No.: US 10,134,823 B2
(45) Date of Patent: Nov. 20, 2018

(54) OLED DISPLAY, DISPLAY DEVICE AND MANUFACTURING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Haisheng Wang, Beijing (CN); Peng Liu, Beijing (CN); Hailin Xue, Beijing (CN); Yiming Zhao, Beijing (CN); Minghua Xuan, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/122,338

(22) PCT Filed: Oct. 30, 2015

(86) PCT No.: PCT/CN2015/093388
§ 371 (c)(1),
(2) Date: Aug. 29, 2016

(87) PCT Pub. No.: WO2016/197524
PCT Pub. Date: Dec. 15, 2016

(65) Prior Publication Data
US 2017/0162643 A1 Jun. 8, 2017

(30) Foreign Application Priority Data
Jun. 11, 2015 (CN) .......................... 2015 1 0319389

(51) Int. Cl.
*H01L 27/32* (2006.01)

(52) U.S. Cl.
CPC ...... *H01L 27/3265* (2013.01); *H01L 27/3209* (2013.01); *H01L 27/3211* (2013.01); *H01L 2227/323* (2013.01)

(58) Field of Classification Search
CPC ............. H01L 27/3265; H01L 27/3209; H01L 27/3211
See application file for complete search history.

(56) References Cited

U.S. PATENT DOCUMENTS

2003/0127652 A1 7/2003 Park et al.
2008/0246042 A1 10/2008 Ting
(Continued)

FOREIGN PATENT DOCUMENTS

CN 103985736 A 8/2014
CN 203850301 U 9/2014
(Continued)

OTHER PUBLICATIONS

International Search Report of PCT/CN2015/093388 in Chinese, dated Mar. 18, 2016 with English translation.
(Continued)

*Primary Examiner* — Douglas Menz
(74) *Attorney, Agent, or Firm* — Collard & Roe, P.C.

(57) ABSTRACT

An organic light emitting diode (OLED) display, a display device and a manufacturing method thereof are provided. The OLED display includes a base substrate; and OLED pixel units arranged on the base substrate in a matrix. Each OLED pixel unit includes at least one OLED structure, and the OLED structure includes a cathode layer, an anode layer and an organic light emitting layer located therebetween, and the OLED pixel unit further includes a pixel circuit that is connected correspondingly with the OLED structure and configured to drive it to illuminate light. The pixel circuit
(Continued)

includes a switching unit and a capacitor located above or below the layer in which the switching unit is located.

10 Claims, 3 Drawing Sheets

(56) References Cited

U.S. PATENT DOCUMENTS

| | | |
|---|---|---|
| 2012/0286320 A1 | 11/2012 | Yamazaki et al. |
| 2014/0284579 A1 | 9/2014 | Tokuda et al. |
| 2014/0312326 A1 | 10/2014 | Moon et al. |
| 2015/0340389 A1 | 11/2015 | Liu et al. |

FOREIGN PATENT DOCUMENTS

| | | |
|---|---|---|
| CN | 104124264 A | 10/2014 |
| CN | 104393026 A | 3/2015 |
| WO | 2015/007053 A1 | 1/2015 |

OTHER PUBLICATIONS

Notice of Transmittal of the International Search Report of PCT/CN2015/093388 in Chinese, dated Mar. 18, 2016.

Written Opinion of the International Searching Authority of PCT/CN2015/093388 in Chinese, dated Mar. 18, 2016 with English translation.

Chinese Office Action in Chinese Application No. 201510319389.0, dated Jun. 28, 2017 with English translation.

Second Chinese Office Action in Chinese Application No. 201510319389.0, dated Dec. 5, 2017 with English translation.

OLED DISPLAY, DISPLAY DEVICE AND MANUFACTURING METHOD THEREOF

CROSS REFERENCE TO RELATED APPLICATIONS

This application is the National Stage of PCT/CN2015/093388 filed on Oct. 30, 2015, which claims priority under 35 U.S.C. § 119 of Chinese Application No. 201510319389.0 filed on Jun. 11, 2015, the disclosure of which is incorporated by reference.

TECHNICAL FIELD

Embodiments of the present disclosure relate to an organic light-emitting diode (OLED) display, a display device including the OLED display and a manufacturing method thereof.

BACKGROUND

As one of the hot research fields in the area of panel displays at present, organic light emitting diode (OLED) displays, compared with liquid crystal displays (LCDs), have advantages such as low energy consumption, low production costs, self-illumination, wide viewing angles, high response speeds and the like, so that at present they are taking the place of conventional LCDs in tablet display devices such as mobile phones, PDAs, digital cameras or the like.

Because the present OLED displays have a large number of thin film transistors in their pixel circuits, how to reduce the ratio of the foot area of the capacitor(s) in a pixel unit to the total foot area of the pixel circuit has drawn a great attention to manufacturers.

SUMMARY

Embodiments of the present disclosure provide an OLED display, a display device including the OLED display, and a manufacturing method thereof, which can reduce the ratio of the foot area of the capacitor in a pixel unit to the total foot area of the pixel unit.

An embodiment of the present disclosure provides an OLED display, including: a base substrate, and OLED pixel units arranged on the base substrate in a matrix. Each OLED pixel unit comprises at least one OLED structure and the OLED structure comprising: a cathode layer, an anode layer, and an organic light emitting layer located between the cathode layer and the anode layer, wherein the OLED pixel unit further comprises a pixel circuit that is connected correspondingly with the OLED structure and configured to drive the OLED structure, and the pixel circuit comprises a switching unit and a capacitor, and the capacitor is located above or below the layer in which the switching unit is located.

Further in some embodiments, the capacitor is located above the layer in which the switching unit is located, the OLED structure is located above the switching unit, and the capacitor is formed by the cathode layer of the OLED structure and a conducting layer located between the cathode layer and the layer in which the switching unit is located.

Further in some embodiments, the switching unit is a thin film transistor comprising a gate layer, an active layer and a source/drain metal layer above the active layer, and the conducting layer is the source/drain metal layer.

Further in some embodiments, the OLED pixel unit comprise three OLED structures disposed therein, which are stacked one on top of another and insulated from each other, and emit red, blue and green light respectively.

Further in some embodiments, the conducting layer has three conducting layer sub-areas corresponding to the three OLED structures and each of the conducting layer sub-areas separately forms a capacitor together with the cathode at the topmost layer of the stack of the three OLED structures.

Further in some embodiments, the capacitor is located above the layer in which the switching unit is located, and a part of each the pixel circuit that is below the capacitor only comprises two switching units, i.e., a driving thin film transistor (TFT) and a switching TFT.

Further in some embodiments, the three OLED structures are connected to three pixel circuits respectively or connected to a same and single pixel circuit.

An embodiment of the present disclosure provides a display device comprising the OLED display of any one embodiment.

An embodiment of the present disclosure provides a manufacturing method for any of the above OLED displays, comprising: providing a pixel circuit, including a switching unit and a capacitor, in an OLED pixel unit, wherein the pixel circuit is connected correspondingly with an OLED structure and configured to drive the OLED structure, and the capacitor is provided above or below a layer in which the switching unit is located.

Further in some embodiments, the capacitors is located above the layer in which the switching unit is located, the OLED structure is located above the switching unit, and the capacitor is formed by the cathode layer of the OLED structure and a conducting layer located between the cathode layer and the layer in which the switching unit is located.

Further in some embodiments, the switching unit is a thin film transistor including a gate layer, an active layer and a source/drain metal layer above the active layer, and the conducting layer is formed synchronously with the source/drain layer.

In embodiments of the present disclosure, an OLED display includes a base substrate and OLED pixel units arranged on the base substrate in a matrix. Each OLED pixel unit includes at least one OLED structure, each of which includes a cathode layer, an anode layer and an organic light emitting layer located therebetween, and the OLED pixel unit further includes a pixel circuit connected correspondingly with the OLED structure and used to drive the OLED structure to illuminate light. The pixel circuit includes a switching unit and a capacitor, and the capacitor is located above or below the layer in which the switching unit is located. With this configuration, the capacitor Cst in the pixel circuit is shifted upward, so that the ratio of the foot area of the capacitor Cst to the total foot area of the pixel circuit is reduced and accordingly a plurality of pixel circuits can be placed into one pixel.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
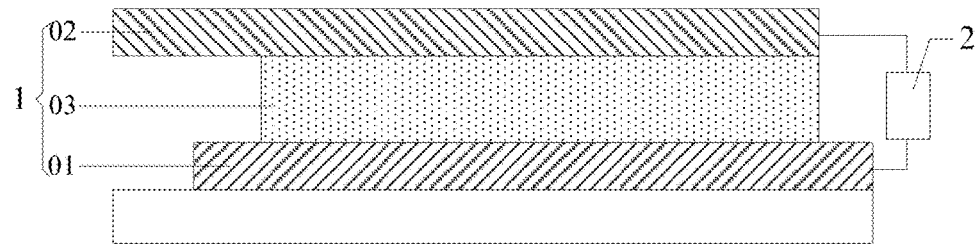
FIG. 1 is a structure diagram of an OLED pixel unit.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Hereafter, in association with the accompanying drawings, specific implementations of the OLED displays and the display devices with the OLED displays provided in embodiments of the present disclosure will be described in detail.

Sizes and shapes of the film layers in the drawings do not reflect the real scale of an OLED display, and only a partial structure of an OLED display is illustrated only for the purpose of illustrating the present disclosure.

FIG. 1 illustrates a structure of an OLED display, which mainly includes a base substrate and OLED pixel units provided on the base substrate. Each OLED pixel unit includes an OLED structure 1 and a pixel circuit 2 that is connected electrically with the OLED structure 1 to drive it to emit light. Specifically, the OLED structure 1 generally includes an anode 01 and an opposite cathode 02 as well as a light emitting layer 03 disposed between the anode 01 and the cathode 02. The OLED display is enabled to illuminate in such an mechanism: a voltage is applied across the anode and the cathode through the pixel circuit, holes in the anode and electrons in the cathode are driven to recombine in the organic light emitting layer to produce excitons, the excitons are transferred by electric fields to pass energy to luminescent molecules in the light emitting layer and activate electrons in the luminescent molecules to transit from ground state to excited state, and then photons are produced from the energy of the excited state through radiation transition.

Unlike LCDs which utilize stable voltages to control their brightness, OLEDs are driven by current and need stable currents to control their light illumination. Because of fabricating process, device aging or other reasons, threshold voltages Vth of driving transistors in 2T1C pixel circuits are not uniform and therefore the currents flowing through the OLEDs of respective pixels vary, resulting in uneven display brightness, which affects the display effect of a whole displayed image and in turn leads to uneven brightness in different areas in an OLED display.

Figure 2:
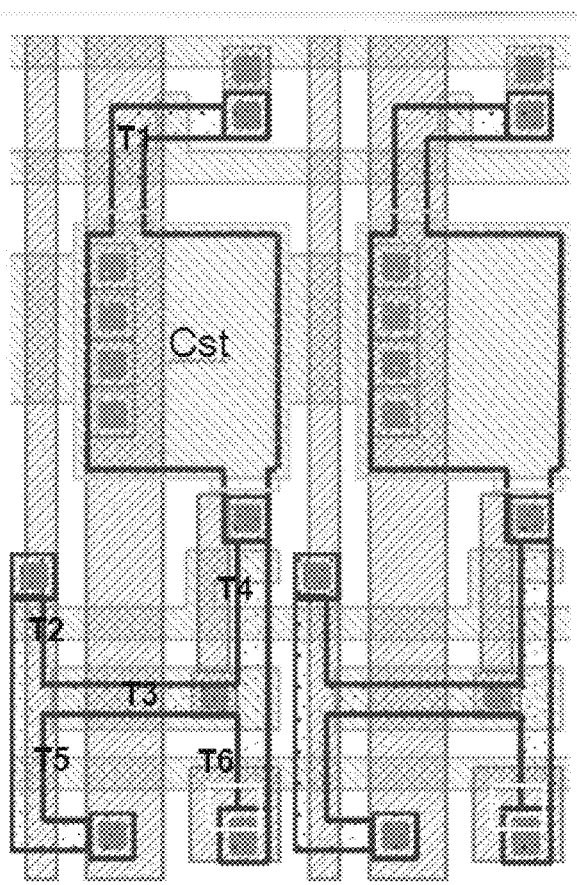
FIG. 2 is a schematic diagram of the arrangement in a pixel circuit.

In order to compensate for the non-uniformity of threshold voltages of driving transistors in pixel circuits, the numbers of thin film transistors and capacitors are increased in pixel circuits, so that the drift of the threshold voltages may be offset by means of the cooperation between the thin film transistors and the capacitors. However, downscaling in size of pixels is greatly restricted due to the increase of the numbers of thin film transistors and capacitors in pixel circuits. FIG. 2 illustrates a 6T1C pixel circuit, which includes six thin film transistors T1-T6 and a capacitor Cst, and the capacitor, as can be seen, has the biggest foot area in the pixel and thus affects the display effect the pixel.

As illustrated in FIG. 2, in the structure of the pixel circuit, it can be seen that the capacitor Cst, apart from the TFTs, occupies the biggest foot area in a pixel. Here, "pixel" in embodiments of the present disclosure corresponds to a "pixel unit" mentioned. That is to say, the term "pixel" has the same meaning as the term "pixel unit." An embodiment of the present disclosure provides an OLED display, which includes a base substrate and OLED pixel units arranged in a matrix on the base substrate. Each OLED pixel unit includes at least one OLED structure, each of which includes a cathode layer, an anode layer and an organic light emitting layer interposed between the anode layer and the cathode layer, and the OLED pixel unit further includes a pixel circuit connected correspondingly with the OLED structure and thus configured to drive the OLED structure to illuminate light. The pixel circuit includes a switching unit and a capacitor, and the capacitor is located above or below the switching unit. This type of OLED display can decrease the ratio of the foot area of the capacitor in the pixel circuit to the total foot area of the pixel circuit.

In some implementations, the pixel circuit includes a plurality of switching units. In some implementations, the capacitor is provided above or below the layer in which all of the switching units are located, or above the layer in which a certain switching unit is located.

By arranging the capacitor above or below the layer in which the switching units are located to shift the Cs upward in the pixel circuit, the ratio of the foot area of the capacitor to the total foot area of the pixel circuit is reduced and in turn a plurality of pixel circuits can be arranged into one pixel.

In some implementations, the capacitor is provided above the layer in which the switching units are located, the OLED structure is located above the switching units, the capacitor is formed by the cathode layer of the OLED structure and a conducting layer, and the conducting layer is located between the cathode layer and the layer in which the switching units are located. In some implementations, when the capacitor is located below the layer in which the switching units are located, the capacitor may be formed by two separate electrode layers or share electrode layers with other existing structures, as long as the functionality of the existing structures is not affected.

In some implementations, the switching unit is a thin film transistor, and the thin film transistor includes a gate layer, an active layer, and a source/drain metal layer above the active layer. The source/drain metal layer acts as the conducting layer, i.e., the conducting layer and the source/drain metal layer share one layer.

In some implementations, the OLED pixel unit includes three OLED structures, which are stacked one on top of another and insulated from each other, and emit red, blue and green light respectively.

In some implementations, each of the three OLED structures is connected a respective pixel circuits, or they are all connected to a same and single pixel circuit.

An embodiment will be specifically illuminated hereafter, in which the capacitor is located above the layer in which the switching unit(s) is located, the OLED structure is located above the layer in which the switching unit(s) is located, and the capacitor is formed by the cathode layer of the OLED structure and a conducting layer located between the cathode layer of the OLED structure and the layer in which the switching unit(s) is located.

At present, a capacitor Cst is mainly formed with a Poly-Si layer and a gate layer, however it is obviously impossible to apply this kind of film layer structure in the OLED pixel unit including a plurality of OLED structures provided in the embodiment of the present disclosure. Therefore, it is proposed in an embodiment of the present disclosure that a conducting layer is added between the source/drain metal layer (SD layer) of the pixel circuit and the grounded electrode, and the conducting layer cooperate together with the cathode at the topmost layer of the layer stack to form a capacitor Cst. In this way, the capacitor Cst in the pixel circuit is shifted upward, so that the ratio of the foot area of the capacitor Cst to the total foot area of the pixel circuit is reduced and so is the foot area of each pixel circuit in a pixel. As a result, a plurality of pixel circuits can be placed into one pixel to control the anodes of each function layer and thus enable colorful display for each pixel.

Figure 3:
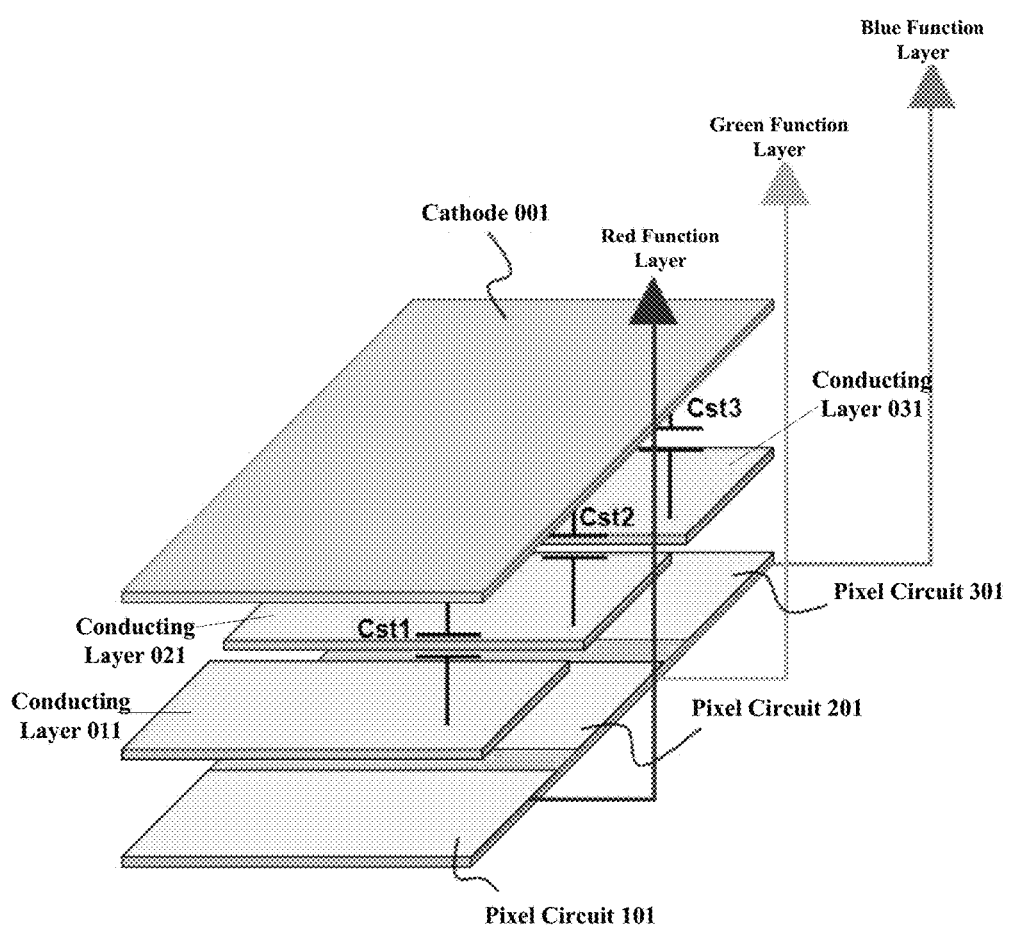
FIG. 3 is a structure diagram of an OLED display provided in an embodiment of the present disclosure.

Specifically, as illustrated in FIG. 3, in the case that a pixel unit includes three OLED structures that are disposed side by side and insulated from each other, which emit red, blue and green light respectively and are each connected to one individual pixel circuit, in an embodiment of the present disclosure the capacitor in each pixel circuit is formed by the cathode 001 shared by all of the three OLED structures in the OLED pixel unit corresponding to the pixel circuit in connection with a conducting layer disposed between the cathode 001 and the TFTs in the pixel circuit (for example, the conducting layer may be the source/drain metal layer, not illustrated in the Figure). In the case that three OLED structures share the same one cathode, as illustrated in FIG. 3, the conducting layer 011 and the cathode 001 form a capacitor Cst1, the conducting layer 021 and the cathode 001 form a capacitor Cst2, and the conducting layer 031 and the cathode 001 form a capacitor Cst3; the capacitor Cst1 is connected to the pixel circuit 101 that is used to control the red function layer, the capacitor Cst2 is connected to the pixel circuit 201 that is used to control the green function layer, and the capacitor Cst3 is connected to the pixel circuit 301 that is used to control the blue function layer.

As can be seen in the aforesaid structure that the conducting layer in one pixel is divided into three conducting layer sub-areas, i.e., the conducting layer sub-areas 011, 021 and 031, which together with the cathode thereabove constitute three capacitors Cst, and these three storage capacitors are located above the pixel circuits, so that the pixel circuits below these capacitors only need to each include a driving TFT and a switching TFT, and thus the capacitors Cst are separated in space from the switching transistors for the pixel circuits, reducing the ratio of the foot area of the Cst to the foot area of the whole pixel circuit and rendering colorful display effect possible for the stack structure.

Figure 4:
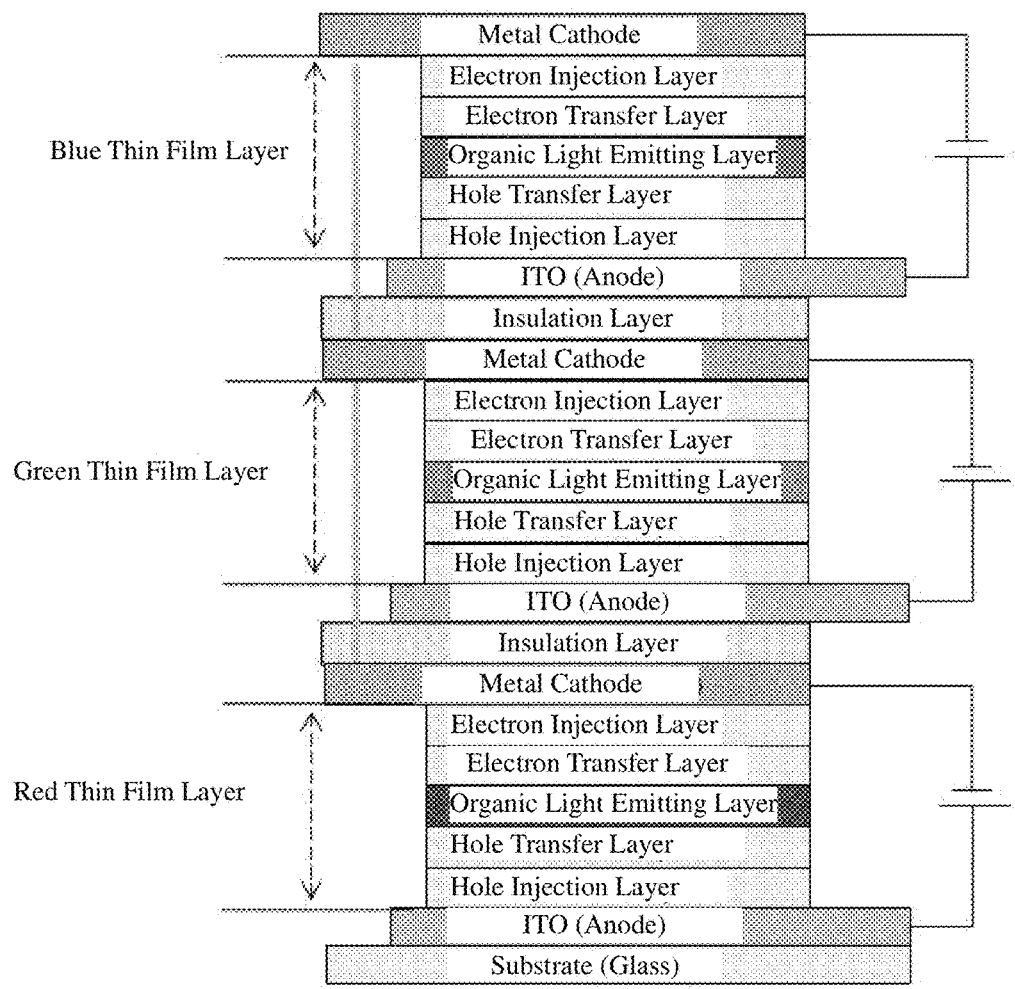
FIG. 4 illustrates an example of the stack configuration of RGB function layers provided in an embodiment of the present disclosure.

FIG. 4 illustrates an implementation of the stack configuration of RGB function layers. In this scheme, any RGB gray scale display effect can be achieved by a single RGB pixel and colorful display can be achieved through cathode sharing.

Additionally, in consideration of the particularity of the structure provided in the embodiment of the present disclosure, the cathode can be grounded all through the operating process of the whole pixel circuit as a grounded electrode.

In an embodiment of the present disclosure, the conducting layer may be composed of any conducting material, including various metal materials, such as copper, aluminum or the like. In embodiments of the present disclosure, the conducting layer is not limited in material and shape.

In some examples, in the above-mentioned OLED display provided in an embodiment of the present disclosure, there may be or may not be the same number of OLED structures in respective OLED pixel units, and there is no limitation in this respect herein.

In some examples, in the above-mentioned OLED display provided in an embodiment of the present disclosure, the OLED structures for light emission of different colors in individual OLED pixel units may be or may not be stacked in the same sequence and there is no limitation in this respect herein.

In some examples, in order to simplify the manufacturing process, in the above-mentioned OLED display provided in an embodiment of the present disclosure, the OLED structures for light emission of different colors in respective pixel units are stacked in the same sequence.

In some examples, in the above-mentioned OLED display provided in an embodiment of the present disclosure, the OLED structure includes an anode, a light emitting layer and a cathode stacked in this sequence. The material of the anode may be indium tin oxide (ITO), and the material of the cathode may be a transparent metal material.

It is to be noted that although the above embodiments of the present disclosure take the OLED pixel unit including three pixel circuits for its OLED structures as an example, the structure design for capacitors in the present disclosure may also be applied in the case that only one pixel circuit for the OLED structures is included, i.e., the three OLED structures may be connected with a same and single pixel circuit, however there is no limitation about this herein.

An embodiment of the present disclosure provides a display device including the OLED display provided in any of the embodiments of the present disclosure. The display devices may be any products or components with display functions, such as mobile telephones, flat computers, TVs, displays, notebook computers, digital picture frames, navigators and the like. Other necessary components of the display device can be understood by those skilled in the art and will not be described any more here, nor will limit the scope of the present disclosure. Embodiments of the above mentioned OLED display may be referred to for implementations of the display device and redundant description will not be described any more here.

An embodiment of the present disclosure provides a manufacturing method for the above-mentioned OLED display, including: providing a pixel circuit in an OLED pixel unit. The pixel circuit is connected correspondingly with an OLED structure and configured to drive the OLED structure. The pixel circuit includes a switching unit and a capacitor, and the capacitor is located above or below the layer in which the switching unit is located.

In some implementations, the capacitor is located above the layer in which the switching unit is located, the OLED structure is located above the switching unit and the capacitor is formed by the cathode layer of the OLED structure along with a conducting layer located between the cathode layer and the layer in which the switching unit is located.

In some implementations, the switching unit is a thin film transistor, and the thin film transistor includes a gate layer, an active layer, and a source/drain metal layer above the active layer. The conducting layer is formed synchronously with the source/drain metal layer.

What has been described above is related to the illustrative implementations of the present disclosure only and not limitative to the scope of the present disclosure; the scope of the present disclosure is defined by the accompanying claims.

The present application claims priority of Chinese patent application No. 201510319389.0 filed on Jun. 11, 2015, the disclosure of which is incorporated herein in its entirety by reference as a part of the present application.

What is claimed is:

1. An organic light-emitting diode (OLED) display, including:
   a base substrate, and
   OLED pixel units arranged on the base substrate in a matrix, each OLED pixel unit comprising at least one OLED structure and the OLED structure comprising:
   a cathode layer,
   an anode layer, and
   an organic light emitting layer located between the cathode layer and the anode layer, wherein
   the OLED pixel unit further comprises a pixel circuit that is connected correspondingly with the OLED structure and configured to drive the OLED structure, and the pixel circuit comprises a switching unit and a capacitor, and the capacitor is located above or below the layer in which the switching unit is located;
   wherein the capacitor is located above the layer in which the switching unit is located, the OLED structure is located above the switching unit, the capacitor is formed by the cathode layer of the OLED structure and a conducting layer, and the conducting layer is located between the cathode layer and the layer in which the switching unit is located;
   wherein the switching unit is a thin film transistor comprising a gate layer, an active layer, and a source/drain metal layer above the active layer, and the conducting layer is the source/drain metal layer.

2. The OLED display of claim 1, wherein the OLED pixel unit comprises three OLED structures disposed therein, which are stacked one on top of another and insulated from each other and emit red, blue and green light respectively.

3. The OLED display of claim 1, wherein the OLED pixel unit comprises three OLED structures disposed therein, which are disposed side by side, the conducting layer has three conducting layer sub-areas corresponding to the three OLED structures, and each of the conducting layer separately sub-areas forms a capacitor together with the cathode at the topmost layer of the each of the three OLED structures.

4. The OLED display of claim 1, wherein the capacitor is located above the layer in which the switching unit is located, and a part of each the pixel circuit that is below the capacitor only comprises two switching units, and the two switching units comprise a driving thin film transistor (TFT) and a switching TFT.

5. The OLED display of claim 2, wherein the three OLED structures are connected to three pixel circuits respectively or connected to a same and single pixel circuit.

6. A display device comprising the OLED display of claim 1.

7. A manufacturing method for the OLED display of claim 1, comprising:
   providing a pixel circuit, including a switching unit and a capacitor, in an OLED pixel unit, wherein the pixel circuit is connected correspondingly with an OLED structure and configured to drive the OLED structure, and the capacitor is provided above or below a layer in which the switching unit is located;
   wherein the capacitor is located above the layer in which the switching unit is located, the OLED structure is located above the switching unit, the capacitor is formed by the cathode layer of the OLED structure and a conducting layer, and the conducting layer is located between the cathode layer and the layer in which the switching unit is located;
   wherein the switching unit is a thin film transistor including a gate layer, an active layer, and a source/drain metal layer above the active layer, and the conducting layer is formed synchronously with the source/drain layer.

8. The OLED display of claim 3, wherein the three OLED structures are connected to three pixel circuits respectively or connected to a same and single pixel circuit.

9. The OLED display of claim 2, wherein the capacitor is located above the layer in which the switching unit is located, and a part of each the pixel circuit that is below the capacitor only comprises two switching units, and the two switching units comprise a driving thin film transistor (TFT) and a switching TFT.

10. The OLED display of claim 3, wherein the capacitor is located above the layer in which the switching unit is located, and a part of each the pixel circuit that is below the capacitor only comprises two switching units, and the two switching units comprise a driving thin film transistor (TFT) and a switching TFT.

* * * * *